(12) United States Patent
Kuo et al.

(10) Patent No.: US 6,680,227 B2
(45) Date of Patent: Jan. 20, 2004

(54) NON-VOLATILE MEMORY DEVICE AND FABRICATION METHOD THEREOF

(75) Inventors: Tung-Cheng Kuo, Lo-Tung (TW); Chien-Hung Liu, Taipei (TW); Shyi-Shuh Pan, Kaohsiung (TW); Shou-Wei Huang, Chilung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/134,223

(22) Filed: Apr. 25, 2002

(65) Prior Publication Data

US 2003/0178652 A1 Sep. 25, 2003

(30) Foreign Application Priority Data

Mar. 20, 2002 (TW) .......................................... 91105279

(51) Int. Cl.[7] .......................................... H01L 21/8238
(52) U.S. Cl. ...................... 438/215; 438/216; 438/257; 438/281; 438/287; 438/288; 438/292; 438/293; 438/467; 438/469; 438/470; 438/591; 438/601; 438/453; 438/4; 257/E21.423; 257/E29.3

(58) Field of Search ................................. 438/215, 216, 438/281, 257, 287, 288, 292, 293, 453, 467, 469, 470, 591, 601, FOR 193, FOR 330; 257/E21.423, E29.3

(56) References Cited

U.S. PATENT DOCUMENTS 6,147,053 A * 11/2000 Nies ............................ 514/12
2001/0046718 A1 * 11/2001 Iranmanesh ..................... 438/4

* cited by examiner

Primary Examiner—George Fourson
Assistant Examiner—Thanh Pham
(74) Attorney, Agent, or Firm—J.C. Patents

(57) ABSTRACT

A nonvolatile read-only memory device, wherein a word line is on a substrate and the word line includes a metal layer a polysilicon line. A trapping layer is further located between the word line and the substrate. A polysilicon protection line is formed over the substrate and the polysilicon protection line connects the word line and a grounded doped region in the substrate, wherein the resistance of the polysilicon protection line is higher than that of the word line.

11 Claims, 6 Drawing Sheets

NON-VOLATILE MEMORY DEVICE AND FABRICATION METHOD THEREOF

CROSS-REFERENCE TO RELATED APPLICATION

This application claims the priority benefit of Taiwan application serial no. 91105279, filed on Mar. 20, 2002.

BACKGROUNDING OF THE INVENTION

1. Field of Invention

The present invention relates to a read-only memory device and the fabrication method thereof. More particularly, the present invention relates to a nonvolatile read only memory device and the fabrication method thereof

2. Description of Related Art

The current fabrication method for a non-volatile read only memory device comprises forming a trapping layer on a substrate, wherein the trapping layer is a stacked structure formed with a silicon oxide/silicon nitride/silicon oxide (ONO) composite layer. A read only memory device that uses an ONO composite layer as the trapping layer is known as a nitride read only memory (NROM). A polysilicon gate is then formed on the ONO layer, followed by forming a source region and a drain region on both sides of the ONO layer in the substrate.

The plasma used in the fabrication of a NROM causes a charge build-up on metal. This phenomenon is known as the "antenna effect". When a transient charge imbalance occurs, charges are injected into the ONO layer inducing a programming effect, leading to the problem of a high threshold voltage. In general, the threshold voltage varies in a wild range of 0.3 V to 0.9 V.

Conventionally, the method to prevent the programming problem resulted from the antenna effect is to form a diode in the substrate connecting electrically with the word line. As the transient charges reach a specific value, the device is discharged by the electric breakdown of the diode. However, when the voltage induced by the charges is less than the breakdown voltage of the diode, the charges may still be injected into the ONO layer to induce the programming effect. In addition, such a design lowers the input voltage of the device and decreases the rate of the writing operation.

SUMMARY OF THE INVENTION

The present invention provides a non-volatile read only memory and the fabrication method thereof, wherein the plasma induced damages on a memory device are prevented.

The present invention provides a non-volatile read only memory and the fabrication method thereof, wherein the transient charge imbalance is obviated to prevent electric charges to be injected into the ONO layer, inducing the programming effect.

The present invention provides a non-volatile read only memory and the fabrication method thereof, wherein a high threshold voltage is prevented.

The present invention provides a non-volatile read only memory and the fabrication method thereof in which the programming problem due to the antenna effect, leading to a lower input voltage and a decrease in the rate of the writing operation is resolved Accordingly, the present invention provides a non-volatile read only memory, wherein a word line is formed over a substrate, and the word line includes a metal layer and a polysilicon line. A trapping layer is located between the word line and the substrate. Moreover, the non-volatile read only memory further comprises a polysilicon protection line formed over the substrate. The polysilicon protection line electrically connects the word line and the grounded doped region in the substrate, wherein the resistance of the polysilicon protection line is higher than that of the word line.

The present invention provides another fabrication method for a non. volatile read only memory, wherein a non-volatile read only memory cell is formed on a substrate. A polysilicon protection line is further formed on the substrate. The polysilicon protection line and the word line of the non-volatile read only memory cell are connected, wherein the resistance of the polysilicon protection line is higher than that of the word line. Thereafter, a grounded doped region is formed in the substrate, followed by forming a contact on the substrate such that the contact connects the grounded doped region and the polysilicon protection line. A metal interconnect is then formed on the substrate. Subsequent to fab-out, a high voltage is applied to burn out the polysilicon protection line.

The present invention further provides another fabrication method for a non-volatile read only memory device, wherein a substrate comprising an isolation region is provided. A trapping layer is then formed on the substrate. After this, a polysilicon layer and a silicide layer are sequentially formed on the substrate. The above layers are further patterned to form a word line for the non-volatile read only memory and a polysilicon line. The thickness of a portion of the polysilicon line is reduced to form a polysilicon protection line above the isolation region. Thereafter, a dielectric layer is formed on the substrate to cover the above devices. A first contact and a second contact that connect the silicide layer and a doped region in the substrate are further formed in the dielectric layer. After the completion of the fabrication process, a high current is applied to burn out the polysilicon protection line.

The present invention provides a fabrication method for an electrically connected polysilicon protection line with the substrate to guide the charges built up in a fabrication process to the substrate. Damages induced to the ONO layer of the nonvolatile memory device and the programming effect are thus prevented. Subsequent to fab-out, a high current is used to burn out the polysilicon protection line, allowing the memory device to operate normally. The transient imbalance charges are discharged through the substrate to prevent the problems encountered in a high threshold voltage due to the trapping of charges in the ONO layer.

Since the resistance of the polysilicon protection line is higher than that of the word line, the polysilicon protection line is burnt out by using a high current after the manufacturing process is completed. Therefore, the input voltage is prevented from being lower to slow down the rate of the writing operation during a normal operation of the memory device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The present invention provides a fabrication method for a non-volatile read only memory device that prevents the plasma-generated antenna effect during the fabrication of the non-volatile read only memory.

FIGS. 1A to 1E illustrate a process flow of fabricating the non-volatile read only memory according to a first aspect of this invention in a cross-sectional view.

Figure 1A:
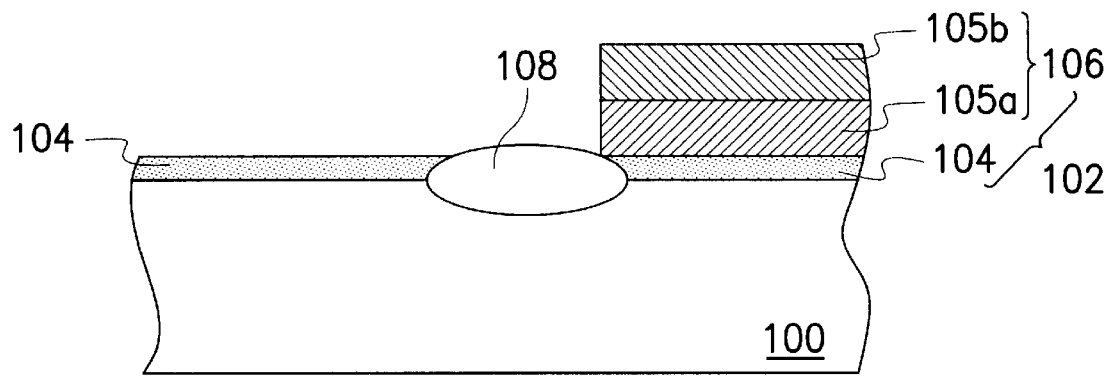
FIGS. 1A to 1E illustrate a process flow of fabricating a non-volatile read only memory according to a first aspect of this invention in a cross-sectional view.

As shown in FIG. 1A, a non-volatile read only memory cell 102 is formed on a substrate 100. The non-volatile read only memory cell 102 includes a trapping layer 104 and a word line 106 thereon, wherein the trapping layer 104 includes a stacked structure of a silicon oxide/silicon nitride/silicon oxide (ONO) composite layer. The word line 106 includes a polysilicon line 105a and a metal layer 105b, wherein the metal layer 105b includes tungsten silicide ($WSi_x$). The substrate 100 further comprises an isolation region 108 that separates the memory cell region and the peripheral circuit region. The isolation region 108, for example, a field oxide layer.

Figure 1B:
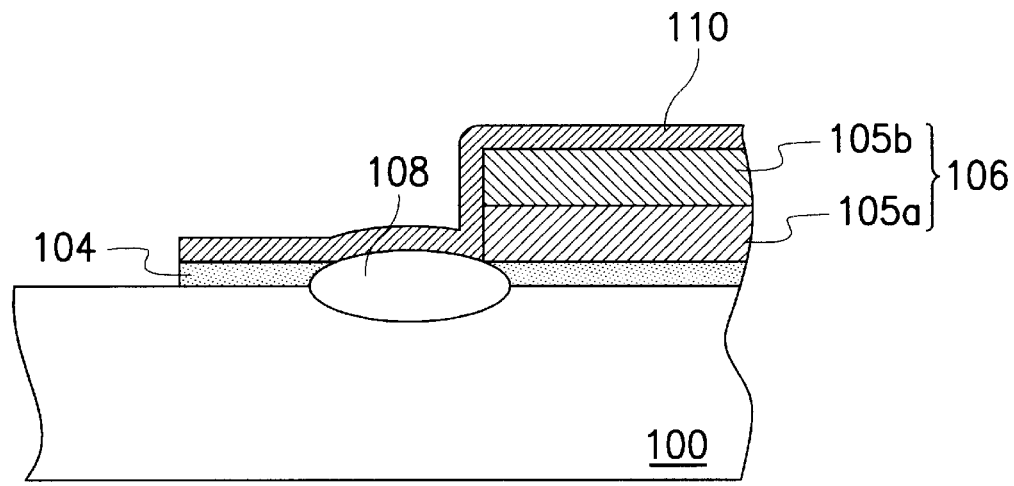

Continuing to FIG. 1B, a polysilicon protection line 110 is formed on the substrate 100, wherein the polysilicon protection line 110 is connected with the word line 106 of the non-volatile memory cell 102. The resistance of the polysilicon protection line 110 is higher than that of the word line 106. In other words, the resistance of the polysilicon protection line 110 is higher than the resistance of the polysilicon line 105a of the word line 106. Moreover, the polysilicon protection line 110 is extended to the peripheral circuit region through the isolation region 108.

Figure 1C:
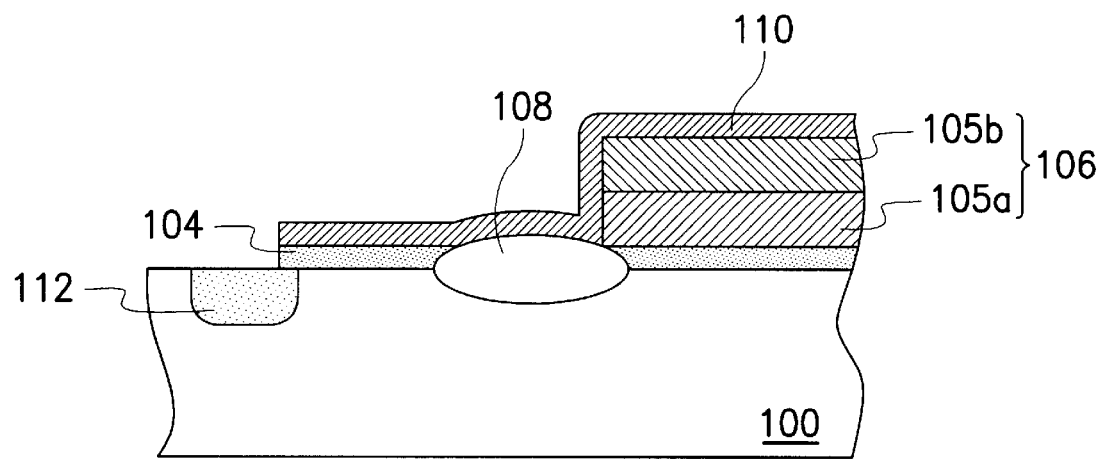

Thereafter, as shown in FIG. 1C, a grounded doped region 112 is formed in the substrate 100 in the peripheral circuit region, wherein at least a portion of the polysilicon protection line 110 is formed above the grounded doped region 112.

Figure 1D:
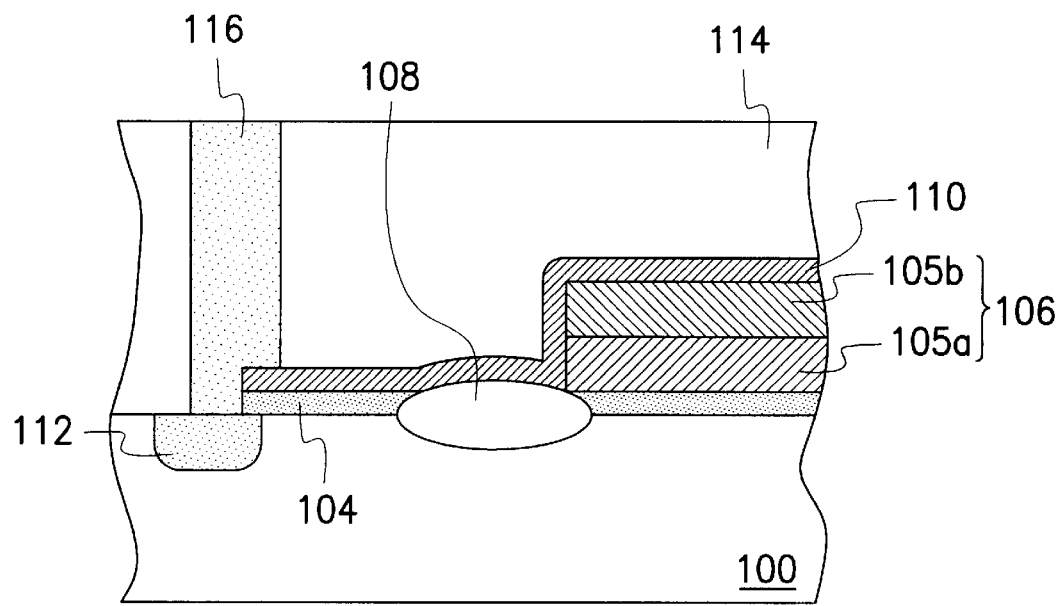

Referring to FIG. 1D, a dielectric layer 114 is formed on the substrate 100, and a contact 116 is formed in the dielectric layer 114, wherein the contact 116 is connected to the grounded doped region 112 and the polysilicon protection line 110.

Figure 1E:
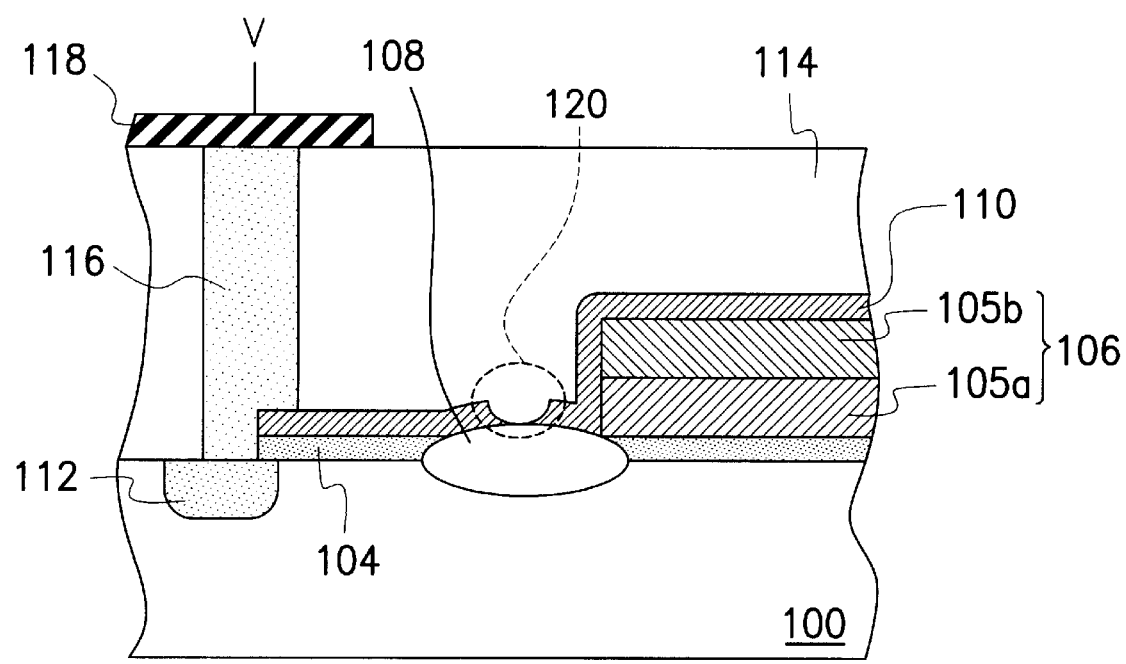

After this, as shown in FIG. 1E, a metal interconnect 118 is formed on the substrate 100. A high current is then applied to burn out the polysilicon protection line 110 after the completion of the fabrication process, and the burnt out region 120 isolate the memory cell region and the peripheral circuit region. As a result, during the operation of the memory device, the input voltage is prevented from being lowered to reduce the rate of the writing operation by the polysilicon protection line 110.

The present invention provides a second aspect of fabricating another type of non-volatile read only memory, as shown in FIGS. 2A, 2B, 3A, 3B, 4A and 4B.

Figure 2A:
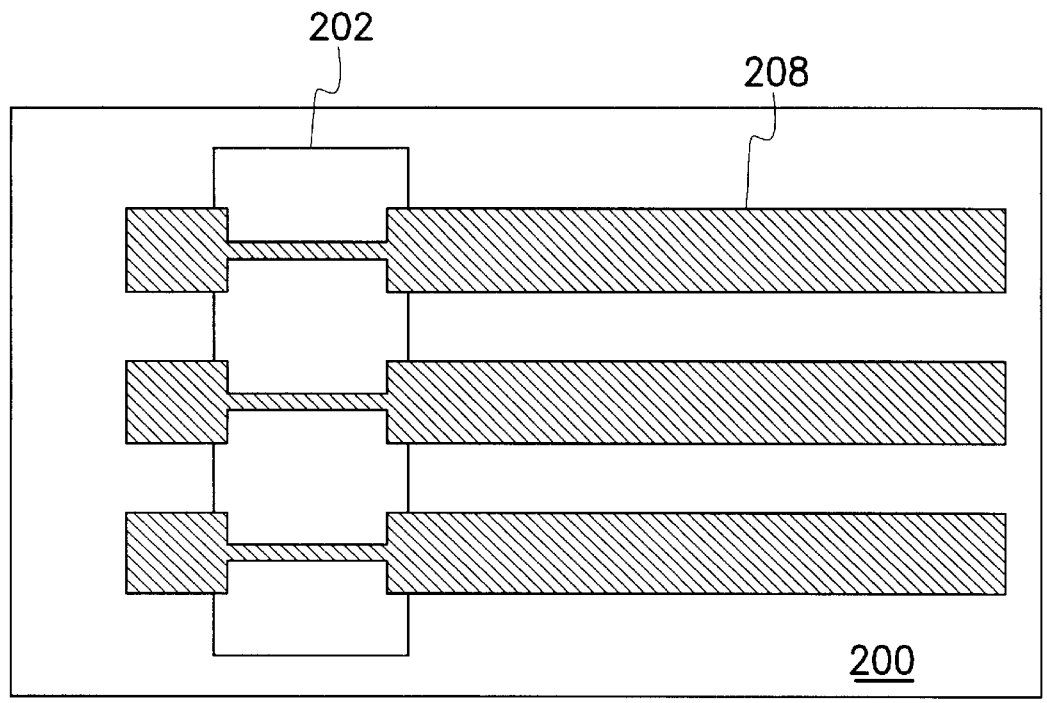
FIGS. 2A to 2B illustrate a process flow of forming a polysilicon line and a silicide word line during the fabrication a non-volatile read only memory according to a second aspect of this invention in a top view and in a cross-sectional view, respectively.
Figure 2B:
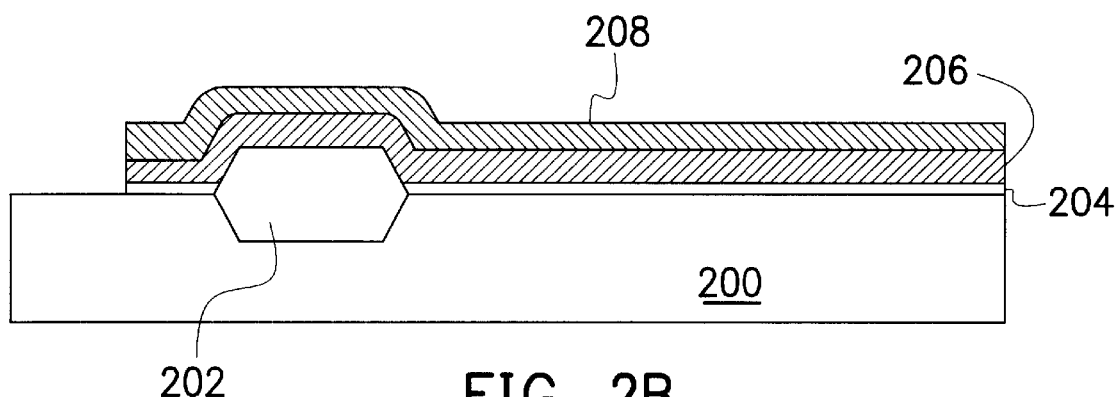

As shown in FIGS. 2A and 2B, a substrate 200 that comprises a field oxide layer as an isolation region 202 is provided. A trapping layer 204 is then formed on the substrate 200, wherein the trapping layer 204 includes a stacked structure of a silicon oxide/silicon nitride/silicon oxide (ONO) composite layer. After this, a polysilicon layer and a silicide layer are sequentially formed on the substrate 200, followed by patterning the above layers to form the word line 208 of the non-volatile read only memory and the underlying polysilicon line 206, wherein the width of the patterned polysilicon line 206 and word line 208 above the isolation region 202 is smaller than that above other region. The word line 208 includes tungsten silicide ($WSi_x$).

Figure 3A:
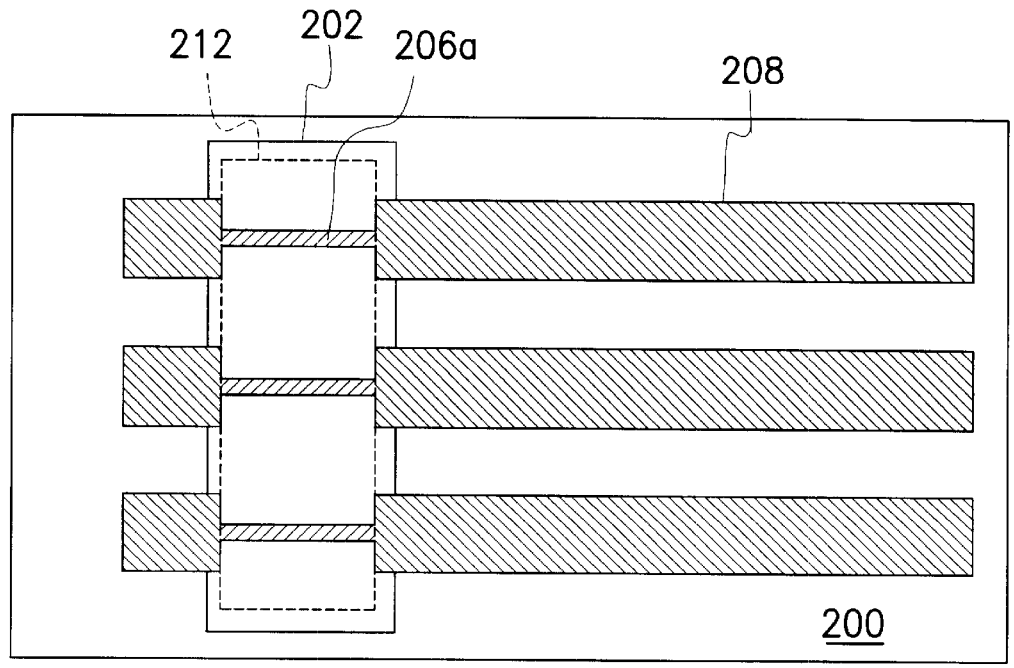
FIGS. 3A to 3B illustrate a process flow of forming a polysilicon protection layer during a fabrication of a non-volatile read only memory according to the second aspect of this invention in a top view and in a cross-sectional view, respectively.
Figure 3B:
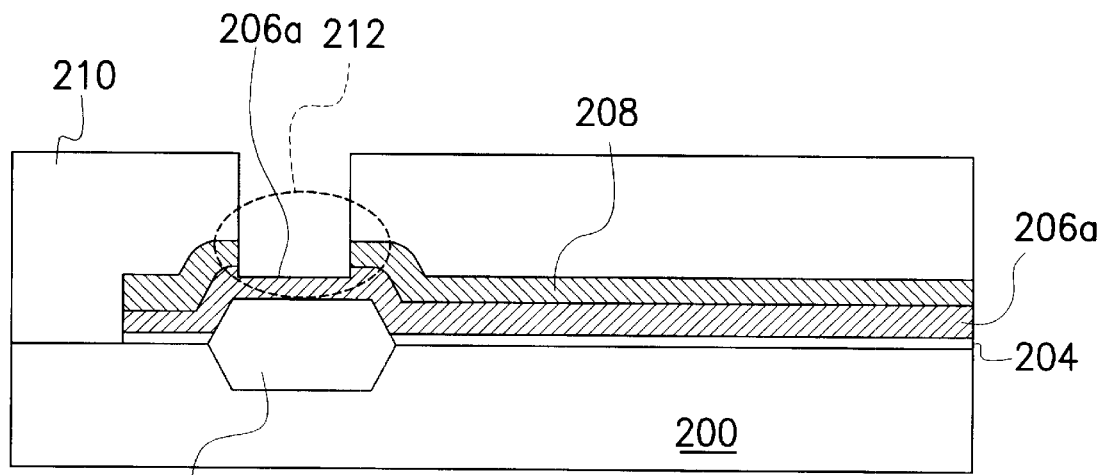

Referring to FIGS. 3A and 3B, a patterned photoresist layer 210 is then formed on the substrate 200, wherein a portion of the word line 208 located above the isolation region 202 is exposed. After this, using the photoresist layer 210 as etching mask, the exposed word line 208 is removed. The etching is continued to the polysilicon line 206 underneath the word line 208 to reduce the thickness of the portion of the polysilicon line 206 that is above the isolation region 202 to form a polysilicon protection line 206a at the region 212.

Figure 4A:
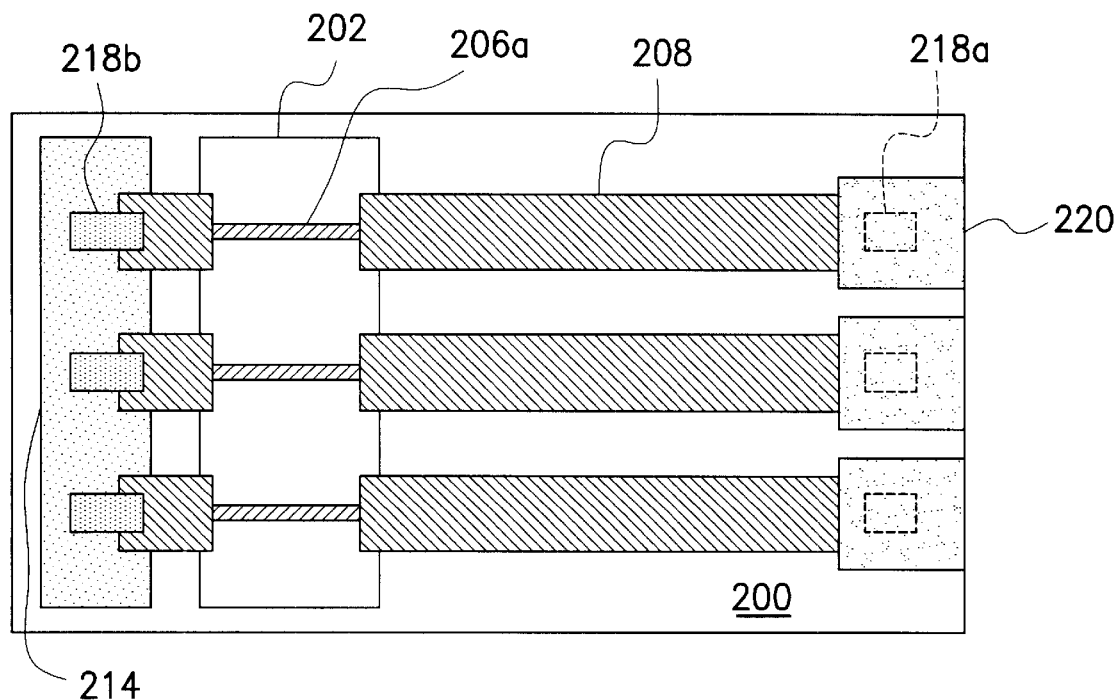
FIGS. 4A to 4B illustrate a process flow of forming an interconnect during a fabrication of a non-volatile read only memory according to the second aspect of this invention in a top view and in a cross-sectional view, respectively.
Figure 4B:
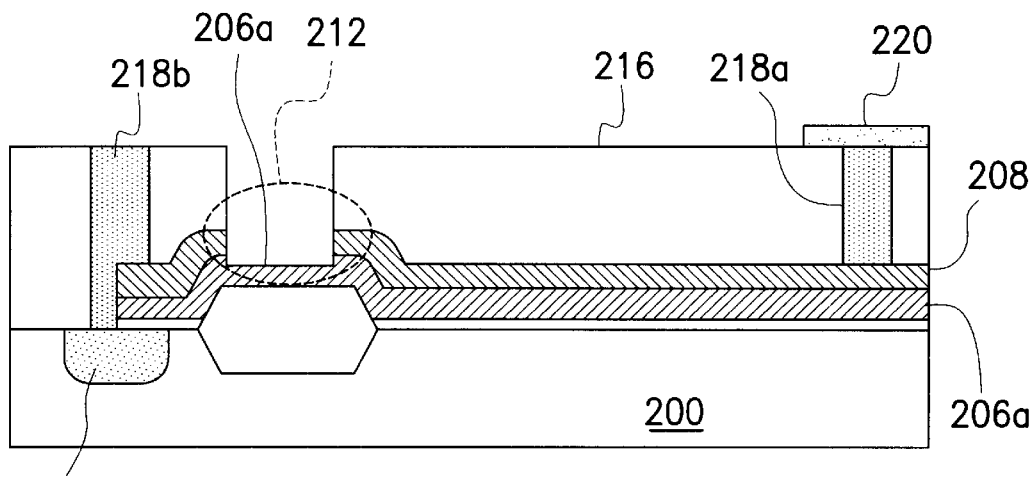

Continuing to FIGS. 4A and 4B, the photoresist layer 210 is removed followed by forming a doped region 214 in the substrate 200. A dielectric layer 216 is then formed on the substrate 200 to cover the above various devices. Contact 218a and contact 218b that respectively connect to the word line 208 and the doped region 214 in the substrate 200 are then formed in the dielectric layer 216 followed by an interconnect manufacturing process. The interconnect manufacturing process is, for example, forming a metal interconnect 220 on the dielectric layer 216 and the metal interconnect 220 connects with the contact 218a. Subsequent to fabrication process, a high current is then applied to burn out the polysilicon protection line 206a. Normally the burnt out region is the narrowest portion 212 of the polysilicon protection line 206a.

In accordance to the present invention, a polysilicon protection line that is electrically connected to the substrate is used to reduce the generation of charges, even under a high pressure environment of a plasma involved process. The transient imbalance charges can be discharged to the substrate through the polysilicon protection line to prevent damages induced on the ONO composite layer of the nonvolatile memory device or to prevent the programming effect, leading to a high threshold voltage.

Accordingly, damages induced on the trapping layer or inducing the programming effect are prevented through the polysilicon protection line. Moreover, a high current is used to burn out the polysilicon protection line subsequent to the manufacturing process to allow a normal function of the memory device.

Since the resistance of the polysilicon protection line of the present invention is higher than that of the word line, a high current is used to burn out the polysilicon protection line subsequent to fab-out. Consequently, a lowering of the input voltage, leading to a decrease of the rate of the writing operation by the polysilicon protection line of the present invention is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a non-volatile read only memory device, comprising:

forming a non-volatile read only memory cell on a substrate;

forming a polysilicon protection line on the substrate, the protection line is connected to a word line of the non-volatile read only memory cell, wherein a resistance of the polysilicon protection line is higher than that of the word line;

forming a grounded doped region; and forming a contact on a substrate, the contact connects the grounded doped region and the polysilicon protection line.

2. The method of claim 1, wherein the method further comprises applying a high voltage to burn out the polysilicon protection line.

3. The method of claim 1, wherein the polysilicon protection line is located on the substrate above an isolation region.

4. The method of claim 1, wherein at least a portion of the polysilicon protection line is formed above the grounded doped region.

5. A fabrication method for a non-volatile read only memory, comprising:

providing a substrate, the substrate comprises an isolation region;

forming a trapping layer on the substrate;

forming a polysilicon layer on the substrate;

forming a silicide layer on the polysilicon layer;

patterning the trapping layer, the polysilicon layer and the silicide layer to form a word line and a polysilicon line, wherein a dimension of the polysilicon line and the word line above the isolation region is smaller than that above other region;

removing the word line and a portion of the polysilicon line above the isolation region to form a polysilicon protection line, wherein a thickness of the polysilicon protection line is less than that of the polysilicon line;

forming a doped region in the substrate;

forming a first contact on the substrate, wherein the first contact connects the doped region and the polysilicon protection line; and forming a second contact on the substrate, wherein the second contact connects the word line.

6. The method of claim 5, wherein the method further comprises applying a high current to burn out the polysilicon protection line.

7. The method of claim 5, wherein the trapping layer includes a silicon oxide/silicon nitride/silicon oxide composite layer.

8. The method of claim 5, wherein the metal layer includes tungsten silicide.

9. The method of claim 5, wherein removing the word line and the portion of the polysilicon line further comprising:

forming a patterned photoresist layer on the substrate, the patterned photoresist layer exposes a portion of the word line above the isolation region;

etching the exposed word line using the patterned photoresist layer as an etching mask;

continuously etching the polysilicon line under the word line to reduce a thickness of a part of the polysilicon line above the isolation region; and removing the patterned photoresist layer.

10. The method of claim 5, wherein the isolation region includes a field oxide layer.

11. The method of claim 5, wherein at least a portion of the polysilicon protection line is formed above the doped region.

* * * * *